(12) United States Patent
McLellan et al.

(10) Patent No.: US 6,790,710 B2
(45) Date of Patent: Sep. 14, 2004

(54) METHOD OF MANUFACTURING AN INTEGRATED CIRCUIT PACKAGE

(75) Inventors: Neil Robert McLellan, Mid Levels (HK); Chun Ho Fan, Sham Tseng (HK); Edward G. Combs, Foster, CA (US); Tsang Kwok Cheung, Fanbury (HK); Chow Lap Keung, Kowloon (HK); Sadak Thamby Labeeb, Rivera Garden (IN)

(73) Assignee: ASAT Limited, Tsuen Wan (HK)

( * ) Notice: Subject to any disclaimer, the term of this patent is extended or adjusted under 35 U.S.C. 154(b) by 3 days.

(21) Appl. No.: 10/062,650

(22) Filed: Jan. 31, 2002

(65) Prior Publication Data

US 2003/0143781 A1 Jul. 31, 2003

(51) Int. Cl.[7] .......................... H01L 21/44; H01L 21/48; H01L 21/50; H01L 21/76; H01L 21/4763

(52) U.S. Cl. ....................... 438/122; 438/122; 438/106; 438/422; 438/619; 438/626

(58) Field of Search ............................. 438/106, 108, 438/111, 123, 611, 614, 618, 619, 422, 617, 626, 112, 122

(56) References Cited

U.S. PATENT DOCUMENTS

| | | |
|---|---|---|
| 3,838,984 A | 10/1974 | Crane et al. |
| 3,908,075 A | 9/1975 | Jackson et al. |
| 3,942,245 A | 3/1976 | Jackson et al. |
| 4,501,960 A | 2/1985 | Jouvet et al. |
| 4,674,175 A | 6/1987 | Stampfli |
| 4,701,781 A | 10/1987 | Sankhagowit |
| 4,975,765 A | 12/1990 | Ackermann et al. |
| 5,023,202 A | 6/1991 | Long et al. |

(List continued on next page.)

FOREIGN PATENT DOCUMENTS

| | | |
|---|---|---|
| FR | 2 609 841 | 1/1987 |
| JP | 3-198368 | 8/1991 |

OTHER PUBLICATIONS

US 5,905,304, 5/1999, Ewer et al. (withdrawn)
Amkor Technology, www.amkor.com, Data Sheet for Laminate, Rev. Date 1/2001 (2pages).

(List continued on next page.)

Primary Examiner—Caridad Everhart
Assistant Examiner—Chuong Anh Luu
(74) Attorney, Agent, or Firm—Milbank, Tweed, Hadley & McCloy LLP

(57) ABSTRACT

In one aspect, the present invention features a method of manufacturing an integrated circuit package including providing a substrate having a first surface, a second surface opposite the first surface, a cavity through the substrate between the first and second surfaces and a conductive via extending through the substrate and electrically connecting the first surface of the substrate with the second surface of the substrate, applying a strip to the second surface of the substrate, mounting a semiconductor die on the strip, at least a portion of the semiconductor die being disposed inside the cavity, encapsulating in a molding material at least a portion of the first surface of the substrate, and removing the strip from the substrate. In another aspect, the invention features an integrated circuit package including a substrate having a first surface, a second surface opposite the first surface, a cavity through the substrate between the first and second surfaces and a conductive via extending through the substrate and electrically connecting the first surface of the substrate with the second surface of the substrate, a semiconductor die electrically coupled with the conductive via, at least a portion of the semiconductor die being disposed inside the cavity of the substrate, an encapsulant material encapsulating a portion of the semiconductor die such that at least a portion of a surface of the semiconductor die is exposed.

48 Claims, 9 Drawing Sheets

U.S. PATENT DOCUMENTS

| | | |
|---|---|---|
| 5,041,395 A | 8/1991 | Steffen |
| 5,122,860 A | 6/1992 | Kikuchi et al. |
| 5,157,475 A | 10/1992 | Yamaguchi |
| 5,157,480 A | 10/1992 | McShane et al. |
| 5,172,213 A | 12/1992 | Zimmerman |
| 5,175,612 A | 12/1992 | Long et al. |
| 5,200,362 A | 4/1993 | Lin et al. |
| 5,258,094 A | 11/1993 | Furui et al. |
| 5,273,938 A | 12/1993 | Lin et al. |
| 5,285,105 A | 2/1994 | Cain |
| 5,285,352 A | 2/1994 | Pastore et al. |
| 5,334,857 A | 8/1994 | Mennitt et al. |
| 5,366,933 A | 11/1994 | Golwalkar et al. |
| 5,397,921 A | 3/1995 | Karnezos |
| 5,409,865 A | 4/1995 | Karnezos |
| 5,420,460 A | 5/1995 | Massingill |
| 5,435,057 A | 7/1995 | Bindra et al. |
| 5,474,957 A | 12/1995 | Urushima |
| 5,482,736 A | 1/1996 | Glenn et al. |
| 5,482,898 A | 1/1996 | Marrs |
| 5,485,037 A | 1/1996 | Marrs |
| 5,521,432 A | 5/1996 | Tsuji et al. |
| 5,556,807 A | 9/1996 | Bhattacharyya et al. |
| 5,583,377 A | 12/1996 | Higgins, III |
| 5,594,275 A | 1/1997 | Kwon et al. |
| 5,596,231 A * | 1/1997 | Combs .................. 257/776 |
| 5,596,485 A | 1/1997 | Glenn et al. |
| 5,620,928 A | 4/1997 | Lee et al. |
| 5,641,997 A | 6/1997 | Ohta et al. |
| 5,642,261 A | 6/1997 | Bond et al. |
| 5,663,593 A | 9/1997 | Mostafazadeh et al. |
| 5,672,909 A | 9/1997 | Glenn et al. |
| 5,679,978 A | 10/1997 | Kawahara et al. |
| 5,693,572 A | 12/1997 | Bond et al. |
| 5,710,064 A | 1/1998 | Song et al. |
| 5,796,038 A | 8/1998 | Manteghi |
| 5,796,163 A | 8/1998 | Glenn et al. |
| 5,805,419 A | 9/1998 | Hundt et al. |
| 5,814,883 A | 9/1998 | Sawai et al. |
| 5,843,808 A | 12/1998 | Karnezos |
| 5,847,455 A | 12/1998 | Manteghi |
| 5,854,511 A | 12/1998 | Shin et al. |
| 5,859,471 A | 1/1999 | Kuraishi et al. |
| 5,867,368 A | 2/1999 | Glenn |
| 5,877,043 A | 3/1999 | Alcoe et al. |
| 5,884,396 A | 3/1999 | Lin |
| 5,886,397 A | 3/1999 | Ewer |
| 5,894,108 A | 4/1999 | Mostafazadeh et al. |
| 5,900,676 A | 5/1999 | Kweon et al. |
| 5,903,052 A | 5/1999 | Chen et al. |
| 5,920,117 A | 7/1999 | Sono et al. |
| 5,939,784 A | 8/1999 | Glenn |
| 5,949,655 A | 9/1999 | Glenn |
| 5,950,074 A | 9/1999 | Glenn et al. |
| 5,962,810 A | 10/1999 | Glenn |
| 5,972,736 A * | 10/1999 | Malladi et al. ............ 438/118 |
| 5,977,640 A | 11/1999 | Bertin et al. |
| 5,981,314 A | 11/1999 | Glenn et al. |
| 5,991,156 A | 11/1999 | Bond et al. |
| 6,001,671 A | 12/1999 | Fjelstad |
| 6,011,694 A | 1/2000 | Hirakawa |
| 6,015,722 A | 1/2000 | Banks et al. |
| 6,034,429 A | 3/2000 | Glenn et al. |
| 6,043,559 A | 3/2000 | Banerjee et al. |
| 6,060,777 A | 5/2000 | Jamieson et al. |
| 6,072,233 A | 6/2000 | Corisis et al. |
| 6,081,029 A | 6/2000 | Yamaguchi |
| RE36,773 E | 7/2000 | Nomi et al. |
| 6,091,603 A | 7/2000 | Daves et al. |
| 6,092,281 A | 7/2000 | Glenn |
| 6,093,960 A | 7/2000 | Tao et al. |
| 6,104,086 A | 8/2000 | Ichikawa et al. |
| 6,111,324 A | 8/2000 | Sheppard et al. |
| 6,117,193 A | 9/2000 | Glenn |
| 6,117,705 A | 9/2000 | Glenn et al. |
| 6,130,477 A | 10/2000 | Chen et al. |
| 6,143,588 A | 11/2000 | Glenn |
| 6,143,981 A | 11/2000 | Glenn |
| 6,150,193 A | 11/2000 | Glenn |
| 6,172,419 B1 | 1/2001 | Kinsman |
| 6,184,463 B1 | 2/2001 | Panchou et al. |
| 6,188,127 B1 | 2/2001 | Senba et al. |
| 6,198,163 B1 | 3/2001 | Crowley et al. |
| 6,201,266 B1 | 3/2001 | Ohuchi et al. |
| 6,201,292 B1 | 3/2001 | Yagi et al. |
| 6,214,644 B1 | 4/2001 | Glenn |
| 6,215,180 B1 | 4/2001 | Chen et al. |
| 6,228,676 B1 | 5/2001 | Glenn et al. |
| 6,229,200 B1 | 5/2001 | Mclellan et al. |
| 6,236,568 B1 | 5/2001 | Lai et al. |
| 6,239,496 B1 | 5/2001 | Asada |
| 6,242,281 B1 | 6/2001 | Mclellan et al. |
| 6,246,115 B1 | 6/2001 | Tang et al. |
| 6,246,566 B1 | 6/2001 | Glenn |
| 6,249,052 B1 | 6/2001 | Lin |
| 6,258,629 B1 | 7/2001 | Niones et al. |
| 6,259,154 B1 | 7/2001 | Niwa |
| 6,265,771 B1 | 7/2001 | Ference et al. |
| 6,266,197 B1 | 7/2001 | Glenn et al. |
| 6,274,927 B1 | 8/2001 | Glenn |
| 6,278,190 B1 | 8/2001 | Tomita |
| 6,281,241 B1 | 8/2001 | Elsner |
| 6,281,568 B1 | 8/2001 | Glenn et al. |
| 6,282,094 B1 | 8/2001 | Lo et al. |
| 6,284,569 B1 | 9/2001 | Sheppard et al. |
| 6,285,075 B1 | 9/2001 | Combs et al. |
| 6,291,884 B1 | 9/2001 | Glenn et al. |
| 6,294,100 B1 | 9/2001 | Fan et al. |
| 6,294,406 B1 | 9/2001 | Bertin et al. |
| 6,294,830 B1 | 9/2001 | Fjelstad |
| 6,294,840 B1 | 9/2001 | McCormick |
| 6,303,997 B1 | 10/2001 | Lee |
| 6,307,755 B1 | 10/2001 | Williams et al. |
| 6,310,403 B1 | 10/2001 | Zhang et al. |
| 6,313,522 B1 | 11/2001 | Akram et al. |
| 6,316,838 B1 | 11/2001 | Ozawa et al. |
| 6,326,678 B1 | 12/2001 | Karnezos et al. |
| 6,395,578 B1 * | 5/2002 | Shin et al. .................. 438/106 |
| 6,396,143 B1 | 5/2002 | Kimbara et al. |
| 6,429,048 B1 | 8/2002 | McLellan et al. |
| 6,429,508 B1 | 8/2002 | Gang |
| 6,433,360 B1 | 8/2002 | R. Dosdos et al. |
| 6,444,498 B1 | 9/2002 | Huang et al. |
| 6,452,255 B1 | 9/2002 | Bayan et al. |
| 6,458,626 B1 | 10/2002 | Huang et al. |
| 6,498,099 B1 | 12/2002 | McLellan et al. |
| 6,507,102 B2 * | 1/2003 | Juskey et al. ............... 257/706 |
| 6,552,417 B2 | 4/2003 | Combs |
| 6,566,740 B2 | 5/2003 | Yasunaga et al. |
| 2001/0000924 A1 | 5/2001 | Karnezos et al. |
| 2002/0079570 A1 | 6/2002 | Ho et al. |

OTHER PUBLICATIONS

U.S. Non–Provisional patent application for "Enhanced Thermal Dissipation Integrated Circuit Package and Method of Manufacturing Enhanced Thermal Dissipation Integrated Circuit Package" (Ser. No. 09/902,878).

English Translation of JP Laid Open Patent Application No. 3–198368 (3 pages).

English Translation of French Publication No. 2 609 871 (14 pages).

U.S. patent application No. 09/902,878 filed Jul. 11, 2001 by Combs et al.

U.S. patent application No. 10/062,896 filed Jan. 31, 2002 by Pedron et al.

U.S. patent application No. 10/104,263 filed Mar. 22, 2002 by Combs et al.

U.S. patent application No. 10/178,372 filed Jun. 24, 2002 by Pedron et al.

* cited by examiner

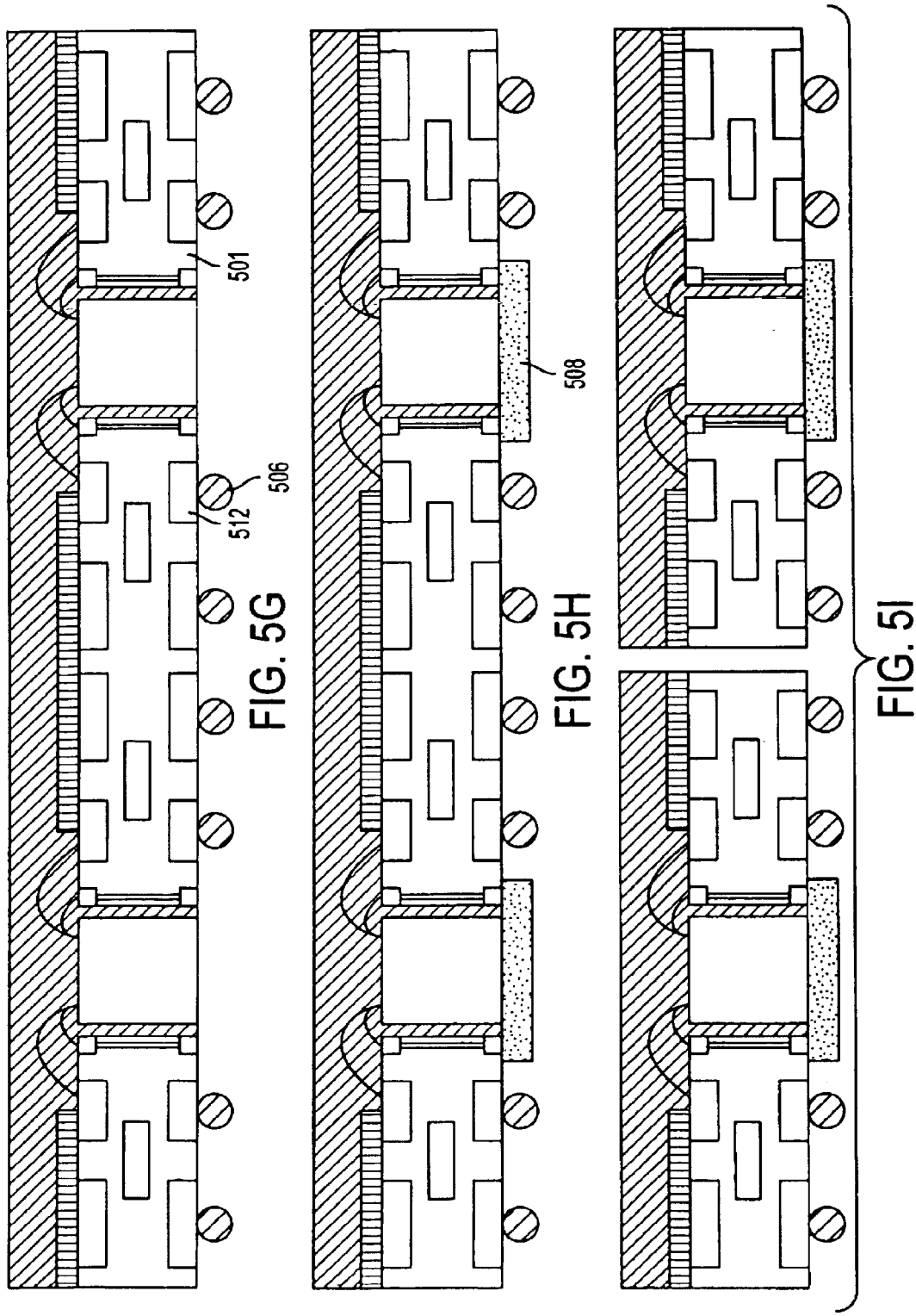

METHOD OF MANUFACTURING AN INTEGRATED CIRCUIT PACKAGE

FIELD OF THE INVENTION

The present invention relates to integrated circuit packaging and manufacturing thereof, and more particularly, to integrated circuit packaging for improved dissipation of thermal energy.

BACKGROUND OF THE INVENTION

A semiconductor device generates a great deal of heat during normal operation. As the speed of semiconductors has increased, so too has the amount of heat generated by them. It is desirable to dissipate this heat from an integrated circuit package in an efficient manner.

A heat sink is one type of device used to help dissipate heat from some integrated circuit packages. Various shapes and sizes of heat sink devices have been incorporated onto, into or around integrated circuit packages for improving heat dissipation from the particular integrated circuit package. For example, U.S. Pat. No. 5,596,231 to Combs, entitled "High Power Dissipation Plastic Encapsulated Package For Integrated Circuit Die," discloses a selectively coated heat sink attached directly on to the integrated circuit die and to a lead frame for external electrical connections.

SUMMARY OF THE INVENTION

In one aspect, the invention features a method of manufacturing an integrated circuit package including providing a substrate having a first surface, a second surface opposite the first surface, a cavity through the substrate between the first and second surfaces and a conductive via extending through the substrate and electrically connecting the first surface of the substrate with the second surface of the substrate, applying a strip to the second surface of the substrate, mounting a semiconductor die on the strip, at least a portion of the semiconductor die being disposed inside the cavity, encapsulating in a molding material at least a portion of the first surface of the substrate, and removing the strip from the substrate.

In another aspect, the invention features a method of manufacturing an integrated circuit package including providing a substrate having a first surface, a second surface opposite the first surface, a plurality of cavities, each said cavity through the substrate between the first and second surfaces, and a plurality of conductive vias, each said via extending through the substrate and electrically connecting the first surface of the substrate with the second surface of the substrate, applying a strip to the second surface of said substrate, mounting a plurality of semiconductor dies on the strip, at least a portion of each semiconductor die being disposed inside each cavity, encapsulating in a molding material at least a portion of the first surface of said substrate, and removing the strip from the substrate to expose a surface of each semiconductor die.

In a further aspect, the invention features an integrated circuit package including a substrate having a first surface, a second surface opposite the first surface, a cavity through the substrate between the first and second surfaces and a conductive via extending through the substrate and electrically connecting the first surface of the substrate with the second surface of the substrate, a semiconductor die electrically coupled with the conductive via, at least a portion of the semiconductor die being disposed inside the cavity of the substrate, an encapsulant material encapsulating a portion of the semiconductor die such that at least a portion of a surface of the semiconductor die is exposed.

BRIEF DESCRIPTION OF THE DRAWINGS

The foregoing features and other aspects of the invention are explained in the following description taken in connection with the accompanying drawings, wherein:

FIGS. 5A–5I show another example of steps performed in assembly of embodiments of an integrated circuit package of the present invention.

DETAILED DESCRIPTION OF PREFERRED EMBODIMENTS

Various embodiments of the integrated circuit package and various examples of methods for manufacturing integrated circuit packages according to the present invention will now be described with reference to the drawings.

Figure 1:
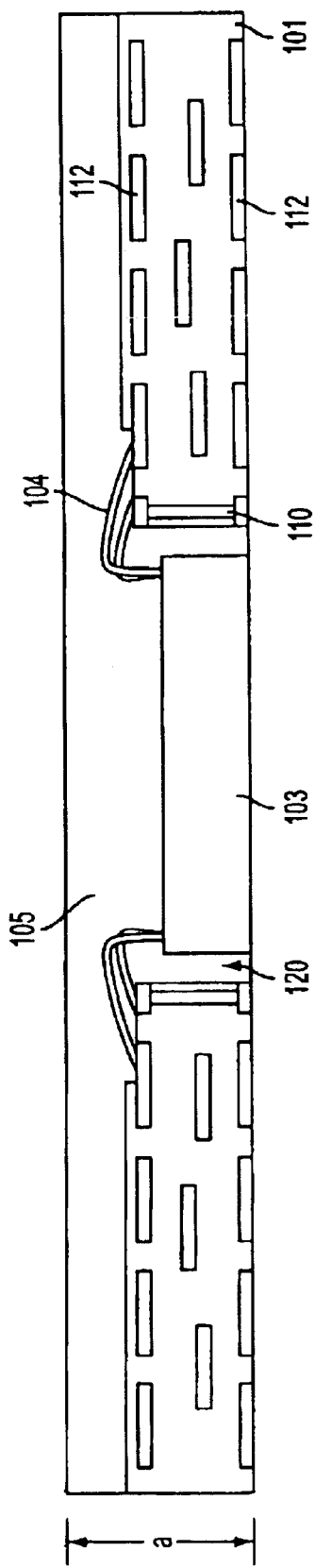
FIG. 1 is a simplified cross-sectional view of an integrated circuit package according to one embodiment of the present invention.
Figure 2:
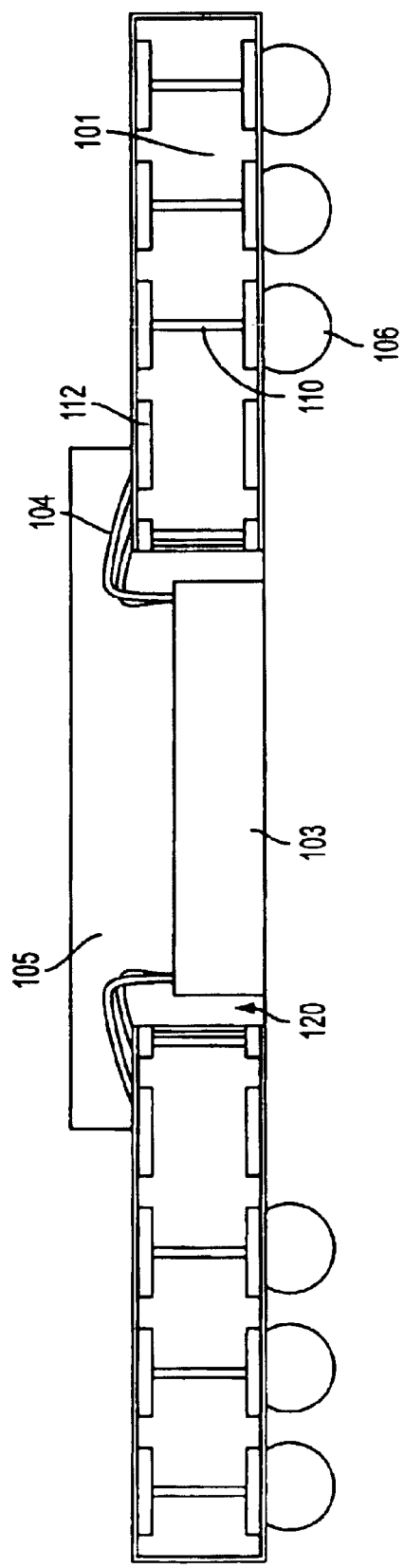
FIG. 2 is a simplified cross-sectional view of an integrated circuit package according to a second embodiment of the present invention.

FIGS. 1 and 2 show certain components of integrated circuit packages according to embodiments of the present invention. The integrated circuit packages depicted in FIGS. 1 and 2 each generally include a substrate 101, a semiconductor die 103 and an encapsulant 105. The substrate 101 may be made of either a rigid material (e.g., BT, FR4, FR5 or ceramic) or a flexible material (e.g., polyimide), and may have circuit traces 112 onto which a semiconductor die 103 may be interconnected using, for example, wire bonding techniques or tape automated bonding. In the embodiment shown in FIG. 1, the package measures about 1.0 mm thick (shown as dimension "a" in FIG. 1) and about 35 mm wide (shown as dimension "b" in FIG. 3). The width dimension of certain other embodiments may vary from 7 mm to 50 mm. However, such dimensions are provided only as non-limiting examples of certain embodiments of the present invention.

As shown in FIG. 2, external terminals of one embodiment of the present invention may include an array of solder balls 106. In such an embodiment, the solder balls 106 may function as leads capable of providing power, signal inputs and signal outputs to the semiconductor die 103. Such a configuration may be referred to as a type of ball grid array. Absent the solder balls 106, such a configuration may be referred to as a type of land grid array, as shown in FIG. 1.

In one embodiment, traces 112 may be embedded photolithographically into the substrate 101, and are electrically conductive to provide a circuit connection between the semiconductor die 103 and the substrate 101. Such traces 112 may also provide an interconnection between input and output terminals of the semiconductor die 103 and external terminals provided on the package. In particular, the substrate 101 of the embodiment shown in FIG. 1 may have a multi-layer circuit trace 112 made of copper. The substrate 101 shown in FIG. 1 has vias 110 which may be drilled into it to connect the top and bottom portions of each circuit trace 112. Such vias 110 may be plated with copper to electrically connect the top and bottom portions of each trace 112. The substrate 101 shown in FIG. 1 may also have a solder mask on its surface. The solder mask of one embodiment electrically insulates the substrate and reduces wetting (i.e., reduces unwanted flow of solder into the substrate 101).

Figure 3:
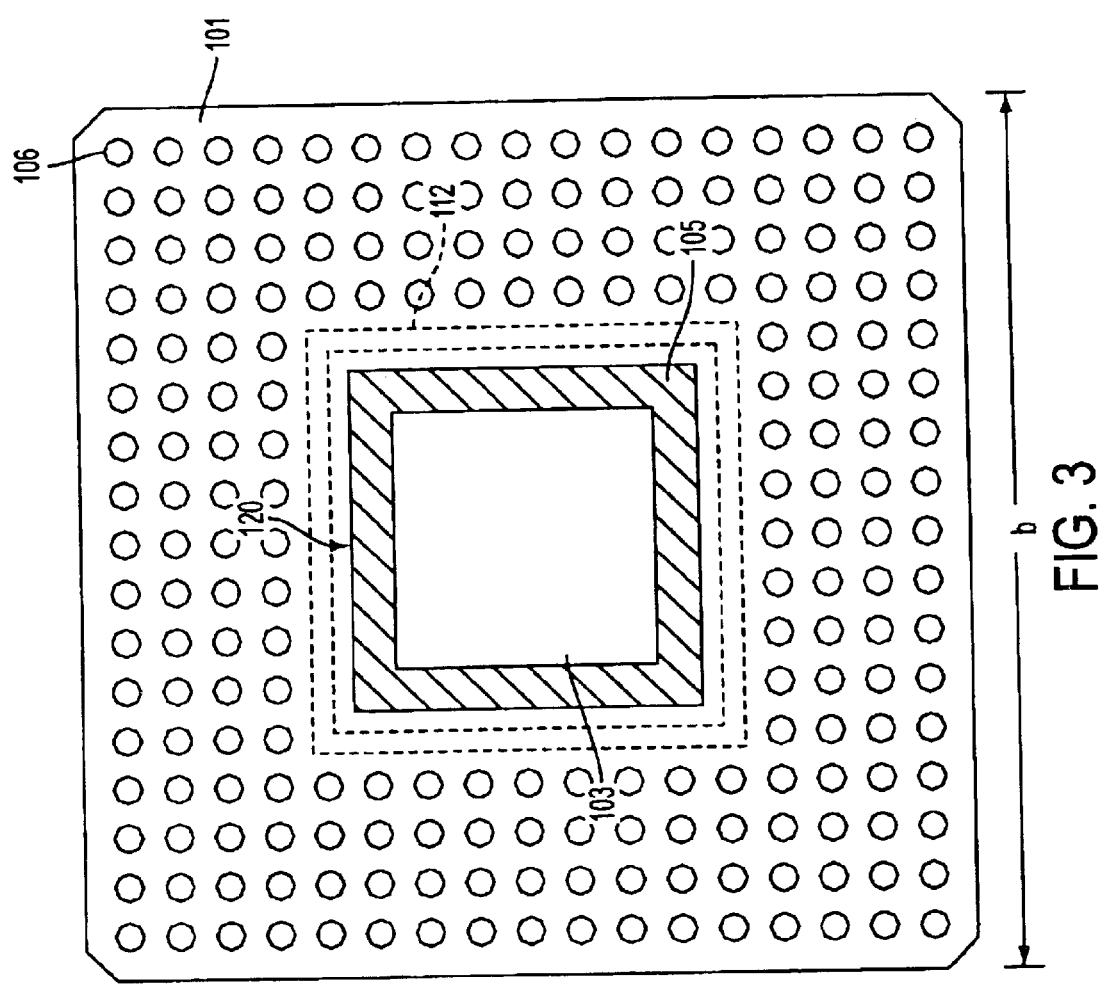
FIG. 3 is a simplified bottom view of an integrated circuit package according to embodiments of the present invention.

As shown in FIGS. 1–3, the substrate 101 is designed with a cavity 120 made through the base material with sufficient clearance to accommodate the specific size of semiconductor die 103 used in the package.

One embodiment may include a conductive trace 112 in the form of a ring around the cavity 120 in the substrate 101. Such a ring-shaped conductive trace 112 may be connected to the top surface of the substrate 101 by means of electrically conductive vias 110. Such an arrangement may allow a heat slug 108 to be electrically connected to the semiconductor die 103 by the way of wire bonding 104, thereby resulting in a ground plane surface beneath the semiconductor die 103, which may enhance the electrical characteristics of the package.

In a preferred embodiment shown in FIG. 2, the encapsulant material 105 does not extend to the package edge. In such an embodiment, electrically conductive vias 110 connect traces 112 from the top surface of the package to corresponding pads 113 on the side of the package opposite to the solder ball attachment.

Figure 4A:
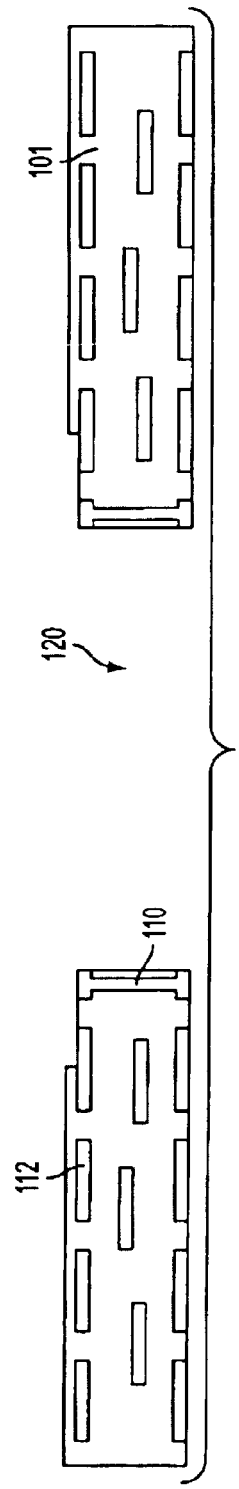
FIGS. 4A–4H show one example of steps performed in assembly of embodiments of an integrated circuit package of the present invention.

Example methods of manufacturing embodiments of the integrated circuit packages will now be described with reference to the drawings, in particular, FIGS. 4A–4H and FIGS. 5A–5I. FIG. 4A shows a step in the manufacture of one type of the integrated circuit package showing a substrate 101 with a cavity 120. The substrate 101 may be produced in a form to accommodate standard semiconductor manufacturing equipment and process flows, and may also be configured in a matrix format to accommodate high-density package manufacturing. FIG. 5A depicts a step in another process for manufacturing integrated circuit packages, and shows a substrate 501 with a number of cavities 520-1, 520-2.

Figure 4B:
Figure 5A:
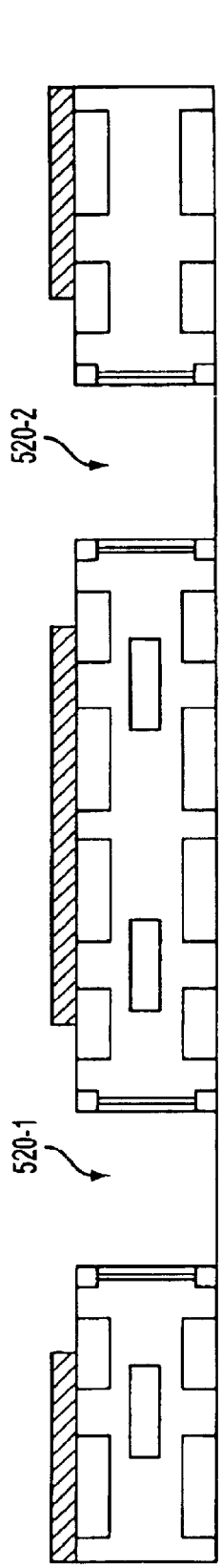
Figure 5B:
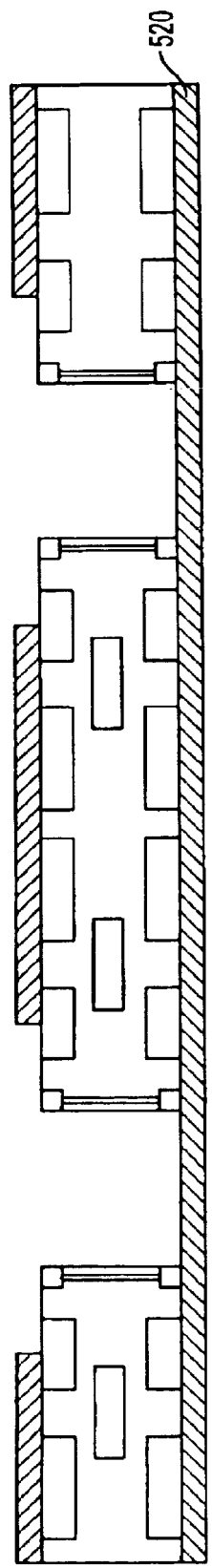

As shown in FIG. 4B, a tape 102 with adhesive material on at least one side is applied to the bottom side of the substrate 101, and may be applied in strip form to accommodate a number of substrates. The tape 102 may be, for example, a high temperature stable polyimide with an adhesive material on at least one surface. FIG. 5B depicts a tape 502 having its adhesive material on the surface which interfaces with the bottom of the substrate 501. In one embodiment, the adhesive material has a contact sticking characteristic such that a semiconductor die 103 placed into contact with the adhesive material will stick to the tape 502. In this embodiment, however, the adhesive material is such that no adhesive residue is left on the substrate 101 when the tape 502 is removed.

Figure 4C:
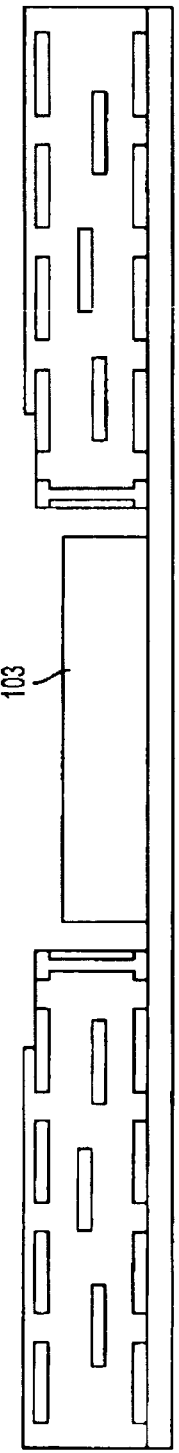
Figure 5C:
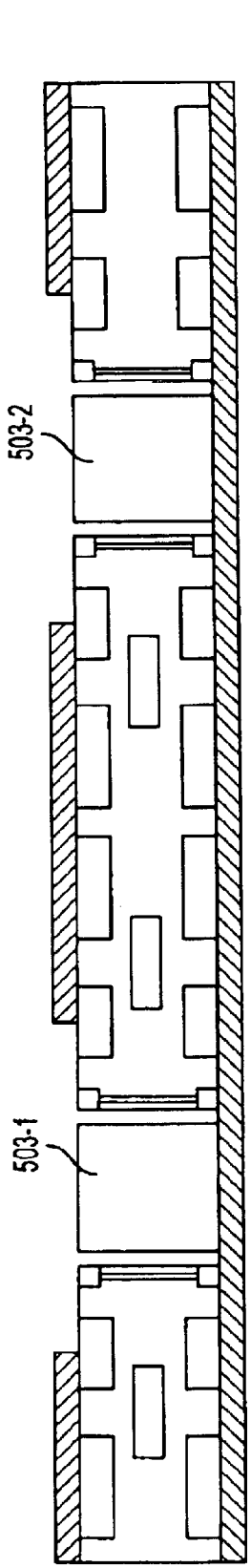

As shown in FIG. 4C, a semiconductor die 103 may then be mounted or otherwise attached to the tape 102 through the cavity 120 in the substrate 101. FIG. 5C depicts a number of semiconductor dies 503-1, 503-2 mounted or otherwise attached to the tape 502 through each of the cavities 520-1, 520-2 of the substrate 501.

Figure 4D:
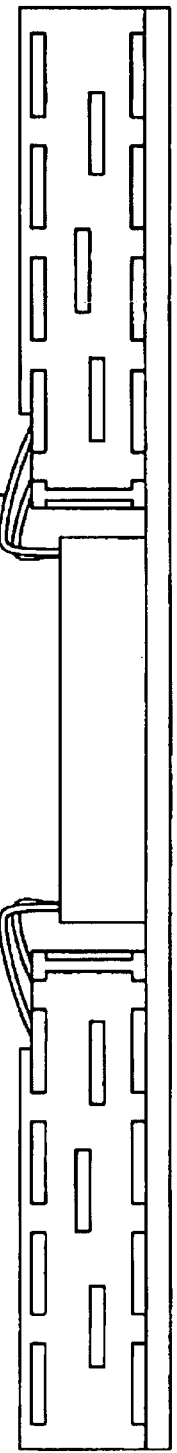
Figure 5D:
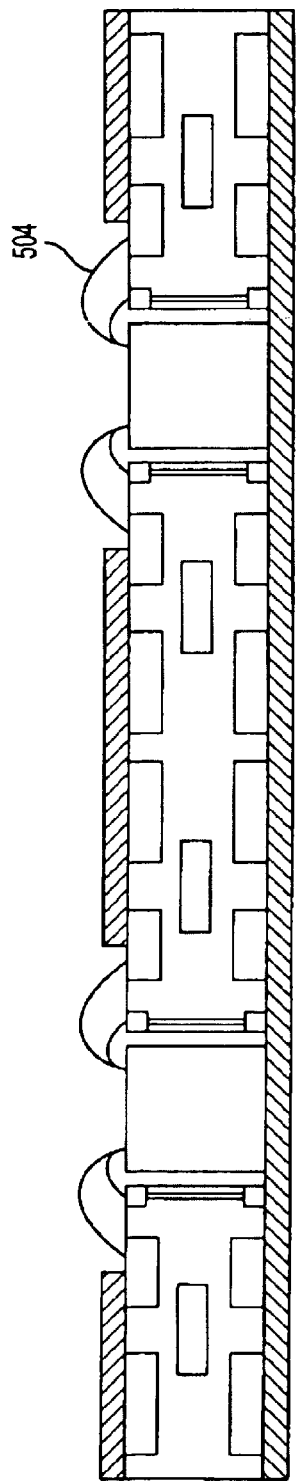

As shown in FIG. 4D, the semiconductor die 103 may then be interconnected to routing traces 112 of the substrate 101 by a gold thermo-sonic wire bonding technique. In such an embodiment, gold wires 104 may interconnect the semiconductor die 103 to traces 112 of the substrate 101. FIG. 5D depicts the semiconductor dies 503-1, 503-2 being interconnected to routing traces by, e.g., a gold thermo-sonic wire bonding technique.

Figure 4E:
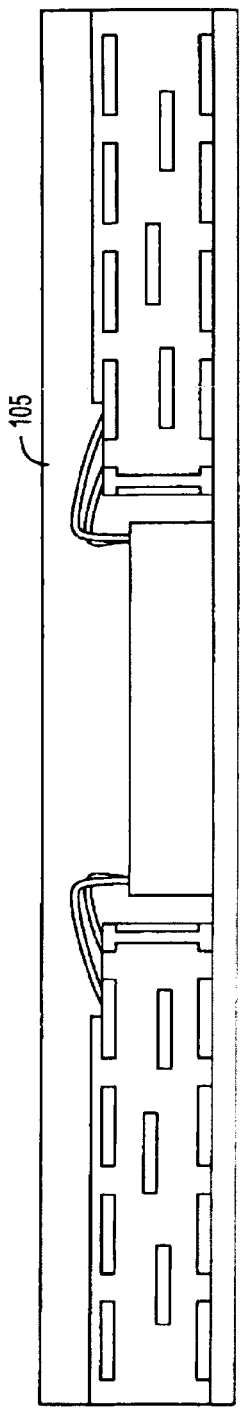
Figure 4F:
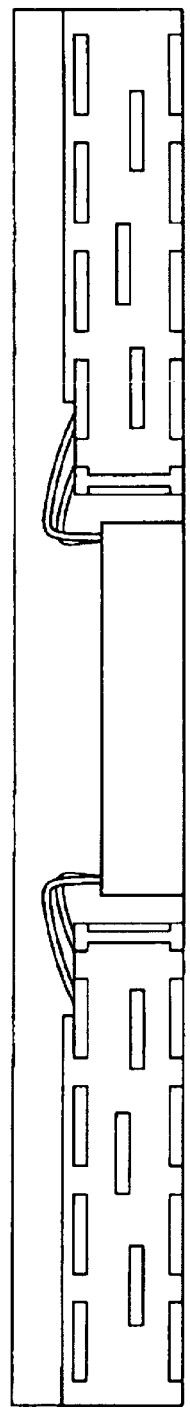
Figure 5E:
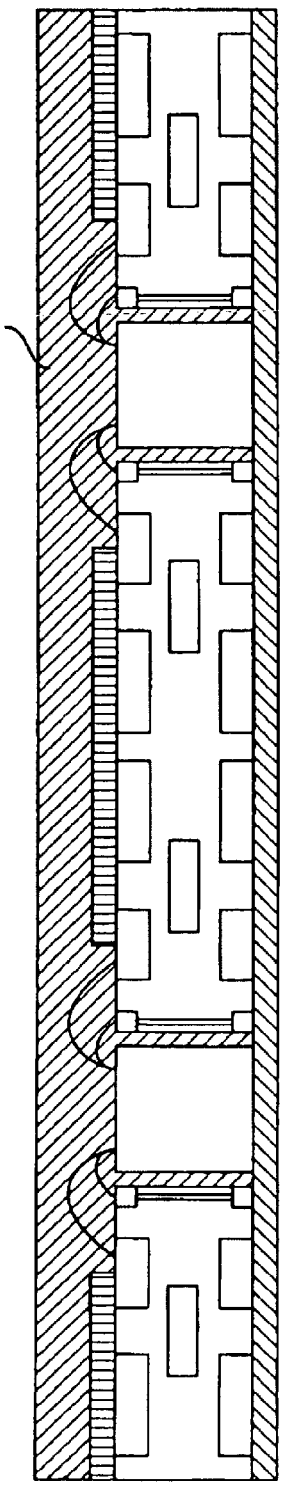
Figure 5F:
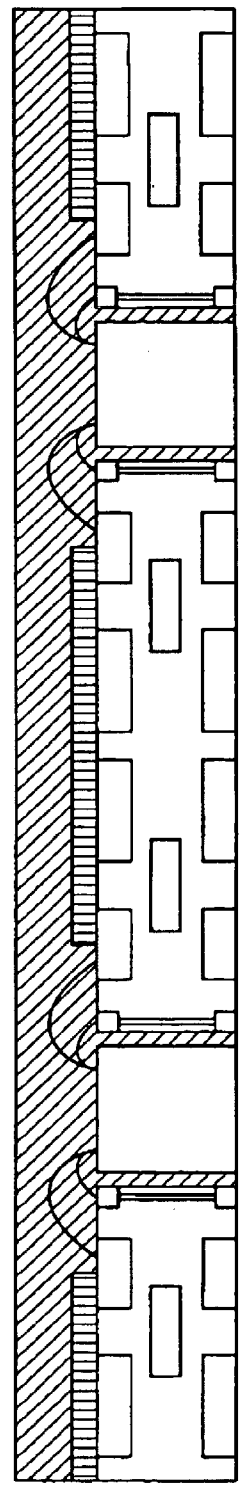

As shown in FIGS. 4E and 5E, after wire bonding, the substrate 101, 501 may be encapsulated. The encapsulant material 105, 505 may be an epoxy based material applied by, for example, either a liquid molding encapsulation process or a transfer molding technique. To manufacture the embodiment of an integrated circuit package shown in FIG. 1, the substrate 101 is fully encapsulated on one side. To manufacture another embodiment of an integrated circuit package (shown in FIG. 2), the substrate 101 is encapsulated only in the semiconductor die 130 and wire bond area, leaving much of the surface of the substrate 101 opposite to the solder ball area free of encapsulant material 105. After an encapsulation process, the tape 102, 502 may then be removed from the package subassembly as shown in FIGS. 4F and 5F.

Figure 4G:
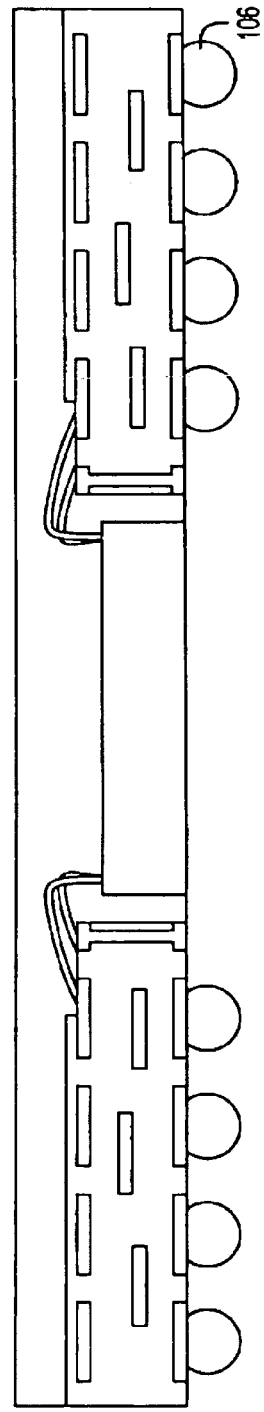

As shown in FIG. 4G, solder balls 106 may then be attached to traces 112 of the substrate 101 using, for example, a reflow soldering process. In another example method of manufacture, FIG. 5G depicts solder balls 506 being attached to traces 512 of the substrate 501. The solder balls 106, 506 may be made of a variety of materials including lead (Pb) free solder.

Figure 4H:
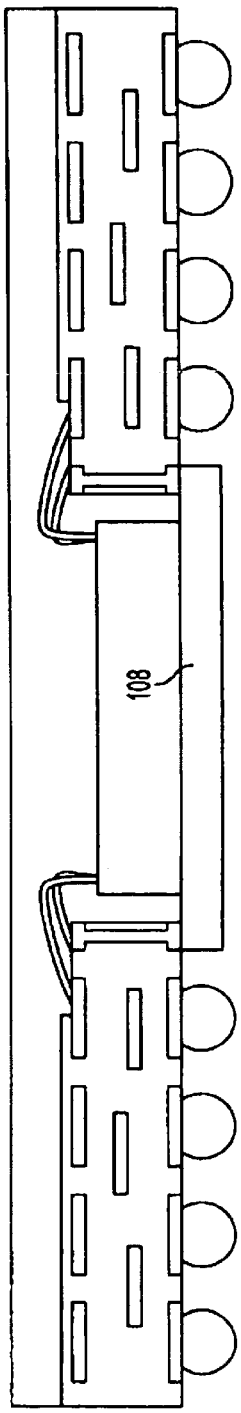

As shown in FIG. 4H, after solder ball attachment, a heat slug 108 may be attached to the exposed surface of the semiconductor die 103 and the area surrounding the cavity 120 in the substrate 101 using a thermally conductive adhesive material 107 such as epoxy. The adhesive material 107, may also be electrically conductive, such as silver-filled epoxy. FIG. 5H depicts attachment of a heat slug 508 to each semiconductor die 503 only. However, an alternative heat slug, such as the one depicted in FIG. 4H, may also be attached to one or more semiconductor dies 503.

As shown in FIG. 5I, after such heat slug attachment, the integrated circuit packages may be singulated into individual units using, e.g., a saw singulation or punching technique.

Figure 6:
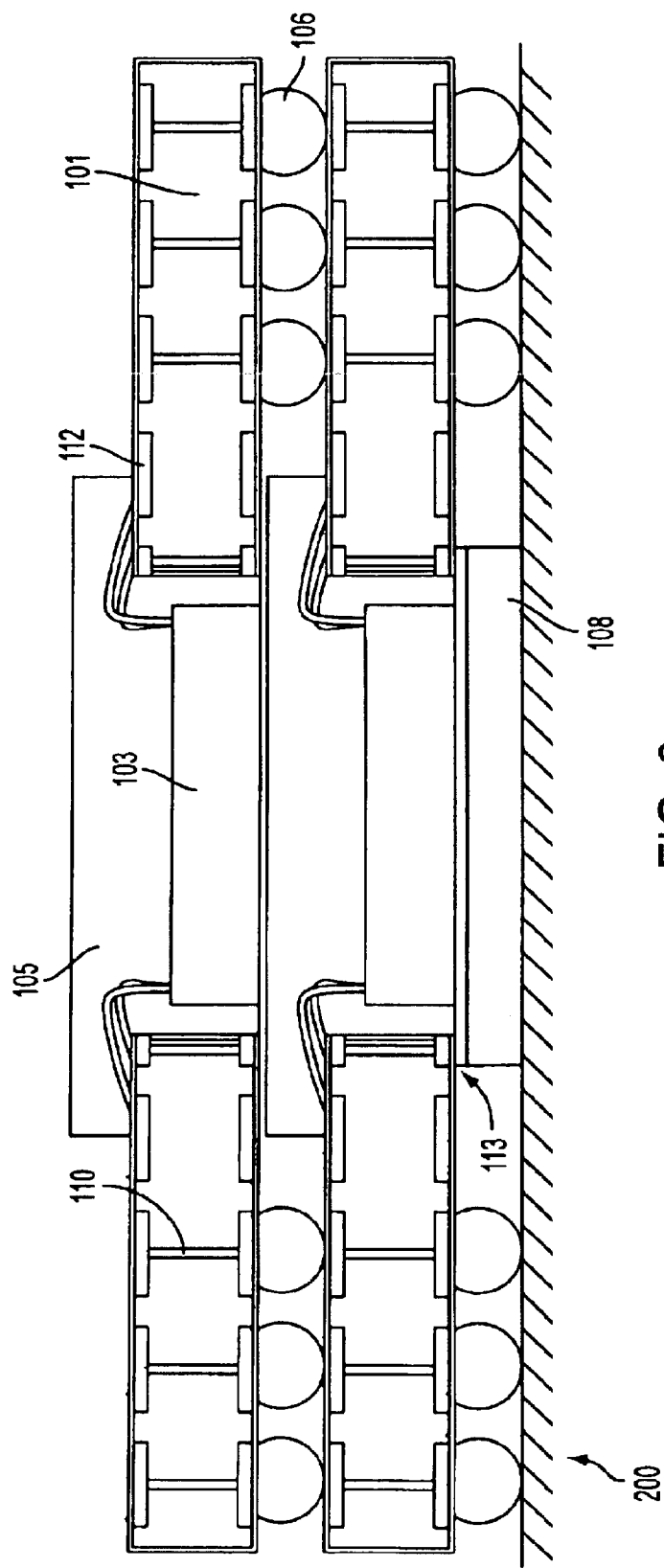
FIG. 6 is a simplified cross-sectional view of an integrated circuit package assembly including an integrated circuit package as shown in FIG. 2 and another integrated circuit package.

FIG. 6 shows an integrated circuit package assembly according to an embodiment of the present invention. As depicted in FIG. 6, such an embodiment includes two integrated circuit packages stacked one on top of the other and attached to one another by solder balls 106. The integrated circuit package assembly shown in FIG. 6 includes two packages of the embodiment shown in FIG. 2 and a heat slug 108. Another embodiment of an integrated circuit package assembly according to the present invention may include two or more integrated circuit packages without a heat slug 108. Other embodiments of integrated circuit package assemblies according to the present invention may include integrated circuit packages other than the embodiments specifically shown in FIG. 6. As shown in FIGS. 1, 2, and 6, the substrate 101 of certain embodiments of integrated circuit packages and assemblies may contain electrically conductive traces 112 on an upper surface of the substrate 101 to facilitate electrical coupling with a second integrated circuit package.

The heat slug 108 shown in FIG. 6 may provide a thermal path between a semiconductor die 103 and the environment. In the embodiment shown in FIG. 6, the heat slug 108 may be aligned with and positioned below the bottom surface of the semiconductor die 103 such that the heat slug 108 may contact or thermally couple with an external device such as, e.g., a printed circuit board 200. The heat slug 108 is preferably made of a thermally conductive material such as copper or copper alloy. The heat slug 108 may be sized and configured for use in a specific package arrangement such that, in certain embodiments, the heat slug 108 contacts another type of external device (e.g., an integrated circuit package) to which a package is attached. The heat slug 108 may be plated with solder or some other appropriate metal to enhance the reflow of solder to the surface of the heat slug 108. The opposite side of the heat slug 108 may also be oxide coated to enhance the adhesion to the encapsulant material 105.

Although specific embodiments of integrated circuit packages, integrated circuit package assemblies, and methods of manufacturing integrated circuit packages have been shown and described, it is to be understood that there are other embodiments which are equivalent to the described embodiments. Moreover, although a particular order of certain manufacturing steps has been discussed, it is to be understood that aspects of the invention are not limited to the particular order disclosed. The scope of the invention is not to be limited by the specific embodiments and examples depicted and described herein, but only by the claims.

What is claimed is:

1. A method of manufacturing an integrated circuit package, comprising:
    providing a substrate comprising:
        a first surface,
        a second surface opposite said first surface,
        a cavity through said substrate between said first and second surfaces, and
        a conductive via extending through said substrate and electrically connecting said first surface of said substrate with said second surface of said substrate;
    applying a strip to said second surface of said substrate;
    mounting a semiconductor die on said strip, at least a portion of said semiconductor die being disposed inside said cavity;
    encapsulating in a molding material at least a portion of said first surface of said substrate;
    removing said strip from said substrate; and
    attaching a thermal element to an exposed surface of said semiconductor die, wherein said attaching comprises attaching said thermal element to said conductive via.

2. The method of claim 1, said encapsulating further comprising filling said cavity with said molding material, wherein a surface of said semiconductor die is exposed to said strip.

3. The method of claim 1, said attaching said thermal element comprising bonding a thermally conductive adhesive to said thermal element.

4. The method of claim 3, said attaching said thermal element further comprising attaching said thermally conductive adhesive to said second surface of said substrate.

5. The method of claim 1, said mounting said semiconductor die comprising disposing said die in its entirety inside said cavity.

6. The method of claim 1, said thermal element comprising a heat slug.

7. The method of claim 1, said substrate further comprising a multi-layer circuit trace.

8. The method of claim 1, further comprising, after said mounting said semiconductor die on said strip, interconnecting said semiconductor die to a first trace embedded in said first surface of said substrate.

9. The method of claim 8, said interconnecting comprising a thermo-sonic wire bonding process.

10. The method of claim 1, said encapsulating comprising a liquid molding process.

11. The method of claim 1, said encapsulating comprising a transfer molding process.

12. The method of claim 1, said encapsulating comprising encapsulating said first surface of said substrate substantially in its entirety.

13. The method of claim 1, further comprising attaching a solder element to a trace embedded in said first surface of said substrate.

14. The method of claim 1, said applying said strip comprising applying an adhesive material on at least a portion of said strip to said second surface of said substrate.

15. The method of claim 1, said strip comprising a high temperature stable polyimide.

16. The method of claim 14, said mounting said semiconductor die comprising attaching said semiconductor die to said adhesive material on said strip.

17. The method of claim 1, said applying said strip further comprising sealing at least a portion of said cavity.

18. A method of manufacturing an integrated circuit package, comprising:
    providing a substrate comprising:
        a first surface,
        a second surface opposite said first surface,
        a plurality of cavities, each said cavity through said substrate between said first and second surfaces, and
        a plurality of conductive vias, each said via extending through said substrate and electrically connecting said first surface of said substrate with said second surface of said substrate;
    applying a strip to said second surface of said substrate;
    mounting a plurality of semiconductor dies on said strip, at least a portion of each said semiconductor die being disposed inside each said cavity;
    encapsulating in a molding material at least a portion of said first surface of said substrate;
    removing said strip from said substrate; and
    for each of said plurality of semiconductor dies, attaching a thermal element to an exposed surface of each said semiconductor die, wherein said attaching comprises attaching said thermal element to at least one of said conductive vias.

19. The method of claim 18, further comprising singulating said substrate into a plurality of integrated circuit packages.

20. The method of claim 19, said singulating comprising a sawing process.

21. The method of claim 19, said singulating comprising a punching process.

22. The method of claim 17, said applying said strip further comprising sealing an entire bottom portion of said cavity.

23. The method of claim 6, wherein said heat slug comprises copper.

24. The method of claim 1, wherein said integrated circuit package is a ball grid array integrated circuit package.

25. The method of claim 1, wherein said integrated circuit package is a land grid array integrated circuit package.

26. The method of claim 8, said interconnecting comprising a tape automated bonding process.

27. The method of claim 1, said substrate comprising a trace electrically connected to said conductive via.

28. The method of claim 27, said trace having a ring-like shape around said cavity.

29. The method of claim 1, said integrated circuit package having a thickness dimension of about 1.0 mm.

30. The method of claim 29, said integrated circuit package having a width dimension of about 7 to 50 mm.

31. The method of claim 30, said integrated circuit package having a width dimension of about 35 mm.

32. The method of claim 3, said thermally conductive adhesive comprising an epoxy.

33. The method of claim 32, said thermally conductive adhesive comprising a silver-filled epoxy.

34. A method of manufacturing an integrated circuit package, comprising:
   providing a substrate comprising:
      a first surface,
      a second surface opposite said first surface,
      a cavity through said substrate between said first and second surfaces, and
      a means for electrically connecting said first surface of said substrate with said second surface of said substrate;
   applying, to said second surface of said substrate, a means for sealing at least a portion of said cavity;
   mounting a semiconductor die on said means for sealing, at least a portion of said semiconductor die being disposed inside said cavity;
   encapsulating in a molding material at least a portion of said first surface of said substrate;
   removing said means for sealing from said substrate; and
   attaching, to at least an exposed surface of said semiconductor die, a means for dissipating heat, wherein said attaching comprises attaching said means for dissipating heat to said means for electrically connecting said first surface of said substrate with said second surface of said substrate.

35. The method of claim 34, said encapsulating further comprising filling said cavity with said molding material, wherein a surface of said semiconductor die is exposed to said means for sealing.

36. The method of claim 34, said attaching said means for dissipating heat comprising bonding a thermally conductive adhesive to said means for dissipating heat.

37. The method of claim 36, said attaching said means for dissipating heat further comprising attaching said thermally conductive adhesive to said second surface of said substrate.

38. The method of claim 34, said mounting said semiconductor die comprising disposing said die in its entirety inside said cavity.

39. The method of claim 34, said substrate further comprising a multi-layer circuit trace.

40. The method of claim 34, said encapsulating comprising encapsulating said first surface of said substrate substantially in its entirety.

41. The method of claim 34, said attaching a means for dissipating heat further comprising attaching said means for dissipating heat to said means for electrically connecting said first surface of said substrate with said second surface.

42. The method of claim 34, said integrated circuit package having a thickness dimension of about 1.0 mm.

43. The method of claim 42, said integrated circuit package having a width dimension of about 7 to 50 mm.

44. The method of claim 43, said integrated circuit package having a width dimension of about 35 mm.

45. The method of claim 18, said substrate comprising a trace electrically connected to said at least one conductive via.

46. The method of claim 45, said trace having a ring-like shape around said cavity.

47. The method of claim 34, said substrate comprising a trace electrically connected to said means for electrically connecting said first surface or said substrate with said second surface of said substrate.

48. The method of claim 47, said trace having a ring-like shape around said cavity.

* * * * *